US007288809B1

(12) United States Patent
Fastow et al.

(10) Patent No.: US 7,288,809 B1
(45) Date of Patent: Oct. 30, 2007

(54) FLASH MEMORY WITH BURIED BIT LINES

(75) Inventors: Richard M. Fastow, Cupertino, CA (US); Chi Chang, Redwood City, CA (US); Sheung Hee Park, Pleasanton, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 10/738,322

(22) Filed: Dec. 16, 2003

(51) Int. Cl.
*H01L 29/72* (2006.01)

(52) U.S. Cl. ...................... 257/314; 257/315; 257/316; 257/401

(58) Field of Classification Search ................ 257/314, 257/353, 296, 315, 316, 401
See application file for complete search history.

(56) References Cited

U.S. PATENT DOCUMENTS 4,053,916 A * 10/1977 Cricchi et al. ............. 257/353
4,222,063 A * 9/1980 Rodgers ..................... 257/322
4,673,962 A 6/1987 Chatterjee et al.
5,006,909 A 4/1991 Kosa
5,102,817 A 4/1992 Chatterjee et al.
5,103,276 A 4/1992 Shen et al.
5,164,917 A 11/1992 Shichijo
5,208,657 A 5/1993 Chatterjee et al.
5,225,697 A 7/1993 Malhi et al.
5,252,845 A 10/1993 Kim et al.
5,300,450 A 4/1994 Shen et al.
5,334,548 A 8/1994 Shen et al.
5,883,406 A * 3/1999 Nishizawa .................. 257/264
5,888,864 A 3/1999 Koh et al.
5,939,760 A 8/1999 Batra et al.
6,060,739 A * 5/2000 Saitoh ........................ 257/314
6,143,610 A * 11/2000 Wen et al. .................. 438/275
6,246,083 B1 6/2001 Noble
6,300,199 B1 10/2001 Reinberg
6,426,252 B1 7/2002 Radens
6,506,638 B1 1/2003 Yu
6,518,615 B1 2/2003 Geusic et al.
6,521,935 B2 2/2003 Krautschneider et al.
6,531,727 B2 3/2003 Forbes et al.
6,537,871 B2 3/2003 Forbes et al.
2003/0048656 A1 3/2003 Forbos
2003/0141538 A1* 7/2003 Hayashi ...................... 257/315

* cited by examiner

*Primary Examiner*—Edward Wojciechowicz

(57) ABSTRACT

A memory cell and a method of forming the same are described. The memory cell is formed on a substrate. The memory cell includes a floating gate that is formed at least in part within the substrate. A bit line region is formed within the substrate in proximity to the floating gate. Because of the configuration of the bit line and the floating gate, memory cells can be located closer to each other, increasing the density of memory cells in a memory array.

9 Claims, 4 Drawing Sheets

100
FLOATING GATE 20
FLOATING GATE 19
FLOATING GATE 14
INTERPOLY DIELECTRIC 12
CONTROL GATE 11
26
TUNNEL OXIDE 13
C
A
SUBSTRATE 10
D
B
CHANNEL 16
BURIED BIT LINE 24
ELECTRON FLOW 17
BURIED BIT LINE 18
BURIED BIT LINE 15

FLASH MEMORY WITH BURIED BIT LINES

TECHNICAL FIELD

The present claimed invention generally relates to semiconductor devices. More specifically, the present claimed invention relates to flash memory cells.

BACKGROUND ART

The architecture of a conventional flash memory array is known in the art. Generally, a memory array includes a number of lines arranged as rows and columns. The rows of the array are commonly referred to as word lines and the columns as bit lines. The word lines and bit lines overlap at what can be referred to as nodes. Situated at or near each node is a memory cell, which is generally some type of transistor. In a virtual ground architecture, a bit line can serve as either a source or drain line for the transistor (memory cell), depending on which memory cell is being program verified or read.

A typical flash memory cell includes a substrate in which source and drain regions have been formed, and a gate element formed on the substrate in proximity to the source and drain regions. The gate element typically includes a floating gate and a control gate separated by an oxide-nitride-oxide (ONO) layer. The gate element and the substrate (specifically, the source and drain regions in the substrate) are typically separated by a tunnel oxide layer that consists of silicon dioxide.

While conventional memory cells perform satisfactorily, it is desirable to scale them down in size so that a greater number of memory cells can be put into a given area. Furthermore, increasing the density of memory cells is expected to increase the speed at which the memory array operates.

Accordingly, a device and/or method that increases the density of memory cells in a memory array would be of value. The present invention provides this and other advantages.

DISCLOSURE OF THE INVENTION

Embodiments of the present invention pertain to flash memory cells and methods of forming the same. In one embodiment, a memory cell is formed on a substrate. The memory cell includes a floating gate that is formed at least in part within the substrate. A bit line region is formed within the substrate in proximity to the floating gate. That is, the bit line is buried within the substrate adjacent to the floating gate. Because of the configuration of the bit line and the floating gate, memory cells can be located closer to each other, increasing the density of memory cells in a memory array.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should be understood as not being drawn to scale except if specifically noted.

BEST MODES FOR CARRYING OUT THE INVENTION

Reference will now be made in detail to embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "forming," "performing," "producing," "depositing," "filling," "implanting" or "etching" or the like, refer to actions and processes (e.g., flowchart 300 of FIG. 3) of semiconductor device fabrication.

Figure 1:
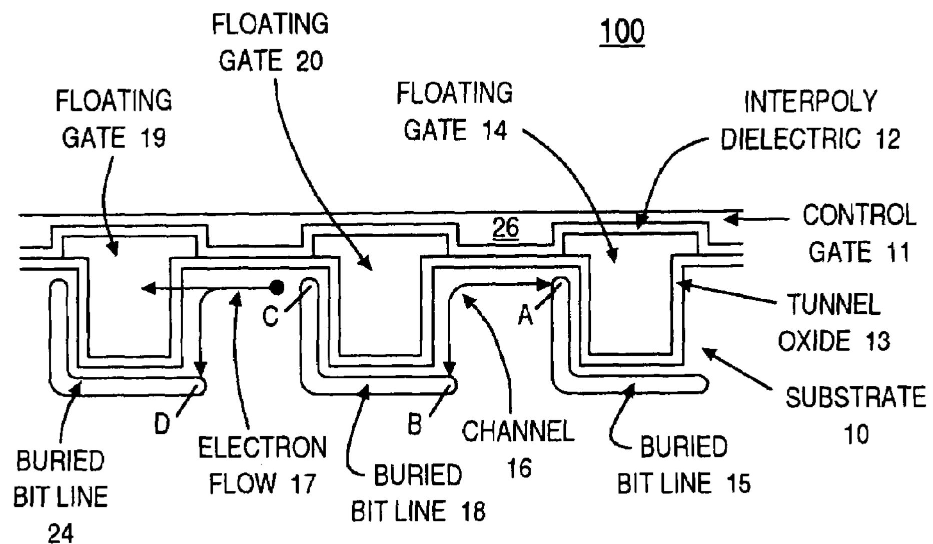
FIG. 1 illustrates a cross-sectional view of a portion of a memory array according to one embodiment of the present invention.

FIG. 1 is a representation of a portion of a memory array 100 according to one embodiment of the present invention. In one embodiment, memory array 100 is a flash memory array.

In the present embodiment, a typical node in the memory array 100 includes a floating gate 14 that is, at least in part, located within substrate 10. That is, a portion of the floating gate 14 is located below the surface of substrate 10, while part of the floating gate 14 extends above the surface of the substrate 10. The other floating gates in the memory array 100 (e.g., floating gates 19 and 20) are also partially buried within the substrate 10.

A tunnel oxide layer 13 separates the floating gate 14 from the substrate 10. A floating gate 11 is situated above the floating gate 14. A dielectric layer ("interpoly dielectric") 12 separates the floating gate 14 from the control gate 11.

Figure 2:
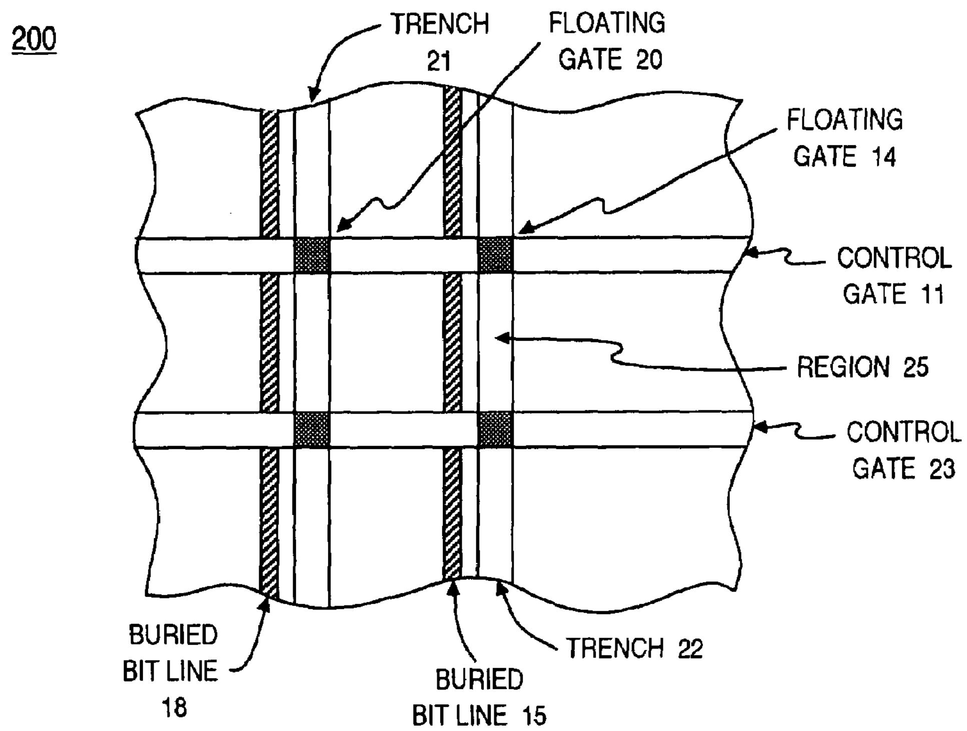
FIG. 2 illustrates a view from above of a portion of a memory array according to one embodiment of the present invention.

Significantly, control gate 11 extends across adjacent nodes and functions as a word line (refer to FIG. 2).

In one embodiment, the dielectric layer 12 has a relatively constant thickness that follows the contours of the substrate 10 and the floating gates 14, 19 and 20. In one embodiment, control gate 11 has a thickness that varies as it follows the contours of the substrate 10 and the floating gates 14, 19 and 20. This is exemplified by region 26 of control gate 11; region 26 of control gate 11 is thicker between the floating gates 14 and 20. In the embodiment illustrated by FIG. 1, the control gate 11 and the dielectric layer 12 extend into the regions between the floating gates 14, 19 and 20, in effect forming a barrier between adjacent floating gates. As such, the capacitance between adjacent floating gates is reduced.

Also of significance, the bit lines (e.g., bit lines 15, 18 and 24) are located within substrate 10. Specifically, the bit lines 15, 18 and 24 are buried within the substrate 10. In the present embodiment, the bit lines 15, 18 and 24 are situated along two adjacent surfaces of a respective floating gate. For example, as can be seen from FIG. 1, bit line 15 is situated along one of the sides of the floating gate 14 and along the bottom of floating gate 14 (here, "bottom" refers to the orientation of FIG. 1). Bit lines 18 and 24 are similarly configured.

In comparison to a node in a conventional memory array, memory array 100 of FIG. 1 incorporates some strikingly different features. For example, as mentioned above, the floating gates of memory array 100 are at least partially buried in the substrate rather than being situated on top of the substrate. Moreover, the nodes of memory array 100 do not include separate source and drain regions as in a conventional memory array. Further comparisons between memory array 100 and a conventional memory array would identify additional differences.

In practice, the features of the present invention offer a number of advantages. First, the memory cells can be located closer to one another, so that a greater number of memory cells can be located within a given area. Importantly, this is achieved while maintaining a satisfactory channel length. That is, relative to the conventional art, the features of the present invention allow memory cells to be situated closer to each other without necessarily reducing channel length. This is demonstrated by looking at representative channel 16 of FIG. 1. The length of channel 16 is greater than the distance between adjacent nodes (e.g., the nodes comprising floating gates 14 and 20). Current flow is from one bit line to another (e.g., from point A on bit line 15 to point B on bit line 18). The distance traveled by this current is greater than the distance between adjacent nodes (e.g., the nodes at bit lines 15 and 18).

Another advantage provided by the present invention is improved programming efficiency. This is demonstrated by considering representative electron flow path 17 of FIG. 1. Electrons flow from point C to point D. Some of the electrons will travel straight from point C into floating gate 19 (sometimes referred to as a ballistic effect). Floating gate 19 is thus in the path of some electrons and, consequently, programming the floating gate is less reliant on the scattering of electrons, as in the conventional art. As a result, floating gate 19 is more efficiently programmed.

In one embodiment, substrate 10 is a silicon substrate, the control gate 11 and the floating gates 14, 19 and 20 are formed of polysilicon, the dielectric layer 12 is formed of oxide-nitride-oxide, the tunnel oxide 13 is silicon dioxide, and the bit lines 15, 18 and 24 are formed using an arsenic dopant. Other suitable materials can be used.

FIG. 2 illustrates a view from above of a portion of memory array 100 according to one embodiment of the present invention, Bit lines 15 and 18 are buried in the substrate of memory array 100 but are shown in FIG. 2 to better visualize certain aspects of the invention.

As mentioned above, control gates 11 and 23 function as word lines. The control gates 11 and 23 are essentially perpendicular to the bit lines 15 and 18. Floating gates 14 and 20, for example, lie at or near the junction of control gate 11 with bit lines 15 and 18, respectively.

FIG. 2 illustrates trenches 21 and 22 running substantially parallel to the bit lines 15 and 18. These trenches facilitate in the forming of the bit lines 15 and 18 and the floating gates 14 and 20, and are described further in conjunction with FIG. 3. In one embodiment, the trenches 21 and 22 are filled with a material such as silicon dioxide after fabrication of the bit lines and floating gates.

Figure 3:
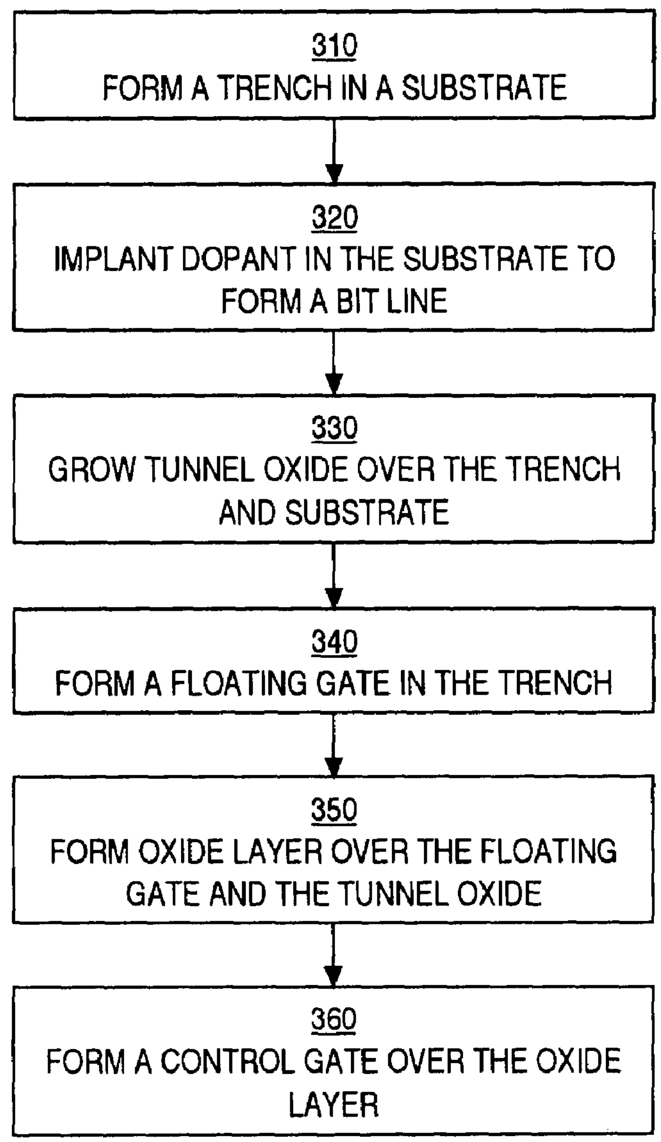
FIG. 3 is a flowchart of a method for forming memory cells according to one embodiment of the present invention.

FIG. 3 is a flowchart 300 of a method for forming memory cells according to one embodiment of the present invention. Although specific steps are disclosed in flowchart 300, such steps are exemplary. That is, the present invention is well suited to performing variations of the steps recited in flowchart 300. It is also appreciated that other processes and steps associated with the fabrication of memory cells may be performed along with the process illustrated by FIG. 3; that is, there may be a number of process steps before, during and after the steps shown and described by FIG. 3. Importantly, embodiments of the present invention can be implemented in conjunction with these other (e.g., conventional) processes and steps without significantly perturbing them. Generally speaking, process steps associated with the various embodiments of the present invention can be added to a conventional process without significantly affecting the peripheral processes and steps.

Various techniques known in the art are used to fabricate a semiconductor device such as a memory cell. In general, these techniques involve repeating, with variations, a number of characteristic steps or processes. One of these characteristic steps or processes involves applying a layer of material to an underlying substrate or to a preceding layer, and then selectively removing the material using, for example, an etch process. Another of the characteristic steps or processes involves selectively adding a dopant material to the substrate or to one or more of the subsequent layers, in order to achieve desirable electrical performance. Using these characteristic processes, a semiconductor, generally comprising different types of material, can be accurately formed. These characteristic processes are known in the art, and so are not elaborated upon herein.

The process of flowchart 300 is described in conjunction with FIGS. 4A through 4E. FIGS. 4A through 4E illustrate memory cells at various stages as they are being formed according to one embodiment of the present invention. For simplicity of discussion and illustration, flowchart 300 is described for a small number of memory cells, although in actuality many such memory cells can be formed.

Figure 4A:
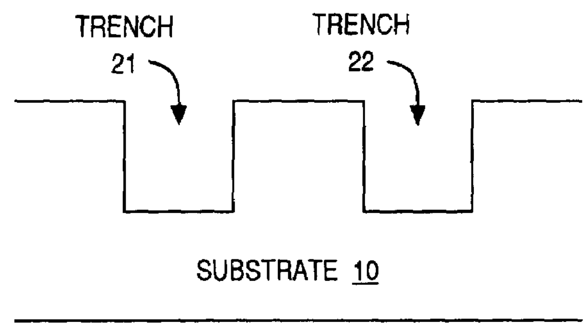
FIGS. 4A, 4B, 4C, 4D and 4E illustrate memory cells at various stages as they are being formed according to one embodiment of the present invention.

In step 310 of FIG. 3, in the present embodiment, and with reference to FIG. 4A, trenches 21 and 22 are formed in a substrate 10. In one embodiment, the substrate 10 is silicon dioxide.

Figure 4B:
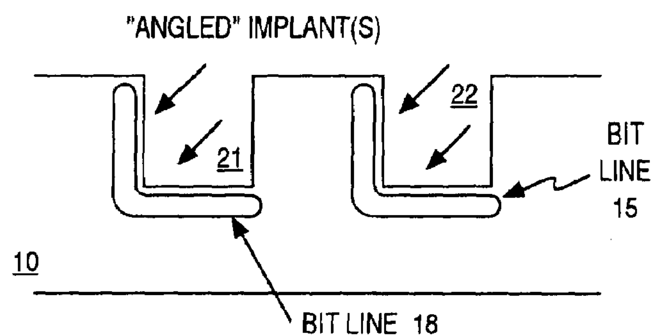

In step 320 of FIG. 3, with reference also to FIG. 4B, a dopant material is implanted at an angle to form bit lines 15 and 18 within the substrate 10 (below the surface of substrate 10). In one embodiment, the dopant material includes arsenic.

Figure 4C:
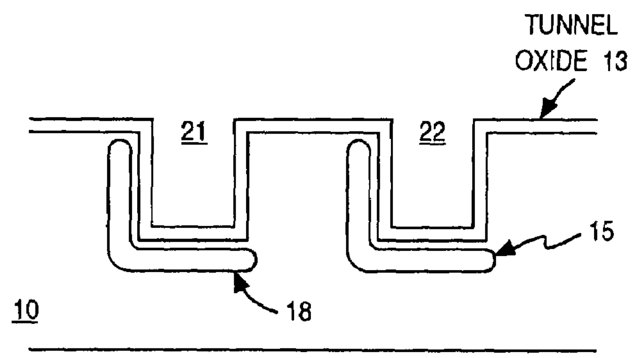

In step 330 of FIG. 3, with reference also to FIG. 4C, a tunnel oxide layer 13 is grown over the surface of the substrate 10, including the sides and bottoms of trenches 21 and 22. In one embodiment, the tunnel oxide layer 13 includes silicon dioxide.

Figure 4D:
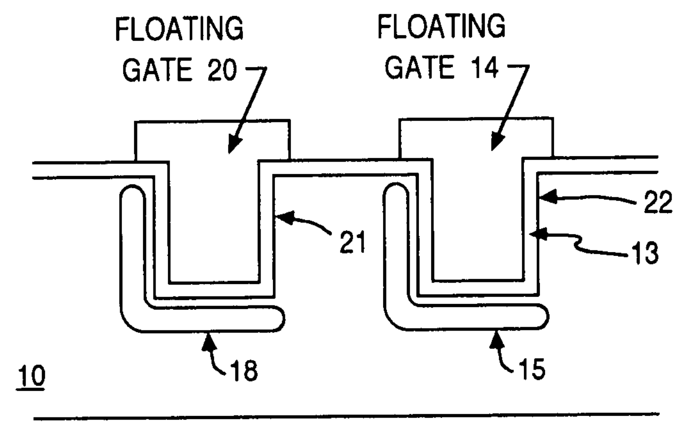

In step 340 of FIG. 3, with reference also to FIG. 4D, floating gates 14 and 20 are formed in the trenches 21 and 22. In one embodiment, the floating gates 14 and 20 are formed using polysilicon.

Figure 4E:
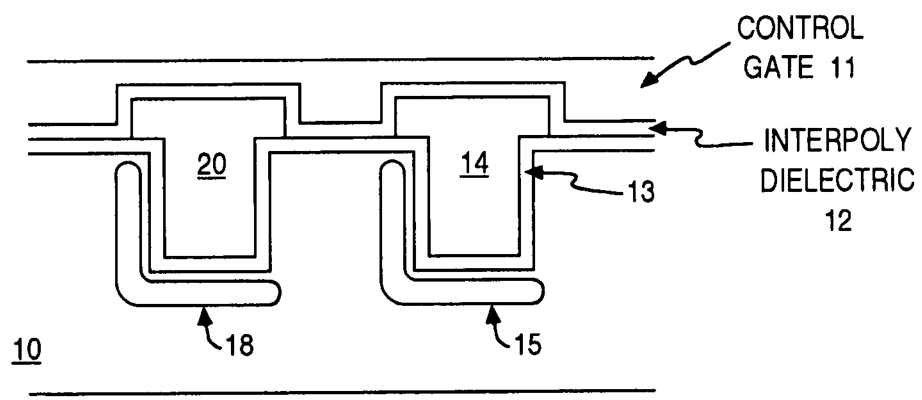

In step 350 of FIG. 3, with reference also to FIG. 4E, a dielectric layer 12 (interpoly dielectric layer) is formed over the floating gates 14 and 20, and also over the exposed portions of the tunnel oxide layer 13. In one embodiment, the dielectric layer 12 includes oxide-nitride-oxide.

In step 360 of FIG. 3, with reference also to FIG. 4E, a control gate 11 is formed over the dielectric layer 12. The control gate 11 is selectively formed over the various nodes to form word lines, as illustrated by FIG. 2. In one embodiment, control gate 11 is formed using polysilicon. As described above, in one embodiment, control gate 11 is thicker in the locations between adjacent floating gates 14 and 20, extending between those floating gates.

In summary, the present invention, in its various embodiments, allows the density of memory cells in a memory array to be increased while maintaining or improving performance.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A flash memory array comprising:

a plurality of floating gates arrayed in rows and columns, said floating gates formed at least in part within a silicon substrate;

a control gate coupling floating gates and functioning as a word line; and a plurality of bit lines, each bit line of said plurality of bit lines essentially perpendicular to said word line, wherein all parts of said bit lines are completely buried within said substrate and all surfaces of said bit lines are completely surrounded by said substrate, said each bit line having an L-shaped cross-section comprising a first portion and a second portion that is essentially at a right angle to said first portion, wherein a first portion of a first bit line is essentially parallel to a first portion of a second bit line, wherein said first portion of said first bit line and said first portion of said second bit line lie in different planes, and wherein further a second portion of said first bit line and a second portion of said second bit line lie in essentially the same plane.

2. The flash memory array of claim 1 wherein said each bit line is formed in proximity to two adjacent surfaces of said floating gates.

3. The flash memory array of claim 2 wherein said each bit line is located below and along one side of a respective floating gate.

4. The flash memory array of claim 1 further comprising:

a dielectric layer formed between said control gate and said floating gates.

5. The flash memory array of claim 4 wherein said oxide layer and said control gate are formed such that they separate adjacent floating gates along said word line.

6. The flash memory array of claim 4 wherein said floating gates and said control gate comprise polysilicon, said bit lines comprise arsenic, and said dielectric layer comprises oxide-nitride-oxide.

7. The flash memory array of claim 1 further comprising:

a tunnel oxide layer formed between said substrate and said floating gates.

8. The flash memory array of claim 1 wherein said first bit line is located at a distance from a first floating gate and wherein said second bit line is located at essentially the same said distance from a second floating gate, wherein said first and second bit lines have essentially the same orientation relative to said first and second floating gates, respectively; wherein a distance traveled by current flowing from said first bit line to said second bit line is greater than the distance between said first and second floating gates.

9. The flash memory array of claim 1 wherein the length of a channel separating an end of said first bit line from an end of said second bit line that is nearest said end of said first bit line is greater than the distance between a first floating gate associated with said first bit line and a second floating gate associated with said second bit line.

* * * * *